(12) United States Patent  (10) Patent No.: US 8,242,582 B2
Min et al.  (45) Date of Patent: Aug. 14, 2012

(54) SEMICONDUCTOR PACKAGE AND STACKED SEMICONDUCTOR PACKAGE HAVING THE SAME

(75) Inventors: Bok Gyu Min, Gyeonggi-do (KR); Jae Myun Kim, Gyeonggi-do (KR); Da Un Nah, Seoul (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 213 days.

(21) Appl. No.: 12/647,657

(22) Filed: Dec. 28, 2009

(65) Prior Publication Data

US 2011/0031591 A1 Feb. 10, 2011

(30) Foreign Application Priority Data

Aug. 10, 2009 (KR) .................. 10-2009-0073514
Nov. 23, 2009 (KR) .................. 10-2009-0113230

(51) Int. Cl.
*H01L 23/00* (2006.01)
(52) U.S. Cl. .. 257/618; 257/686; 257/777; 257/E23.002
(58) Field of Classification Search .................. 257/618, 257/678–733, 787–796, E23.001–E23.194
See application file for complete search history.

(56) References Cited

U.S. PATENT DOCUMENTS

| 7,214,568 B2 | 5/2007 | Brennan et al. | |
| 7,446,420 B1* | 11/2008 | Kim | 257/777 |
| 2004/0026768 A1 | 2/2004 | Taar et al. | |

FOREIGN PATENT DOCUMENTS

| KR | 1020050018813 A | 2/2005 |
| KR | 1020050028713 A | 3/2005 |

* cited by examiner

*Primary Examiner* — Mamadou Diallo
(74) *Attorney, Agent, or Firm* — Ladas & Parry LLP

(57) ABSTRACT

A semiconductor package includes a semiconductor chip possessing a shape with corners and has a circuit section. The semiconductor chip has one or more chamfered portions which are formed in a first corner group that includes one or more of the corners. Data bonding pads are disposed on the semiconductor chip and are electrically connected to the circuit section. A chip selection pad is disposed adjacent to a second corner group that includes at least one of the corners which is not formed with a chamfered portion. The chip selection pad is electrically connected to the circuit section. A plurality of the semiconductor packages may be stacked so that the chip selection pad of one of the semiconductor packages is left exposed when another semiconductor package is stacked thereover due to the chamfered portion of the other semiconductor package.

18 Claims, 6 Drawing Sheets

SEMICONDUCTOR PACKAGE AND STACKED SEMICONDUCTOR PACKAGE HAVING THE SAME

CROSS-REFERENCE TO RELATED APPLICATIONS

The present application claims priority to Korean patent application number 10-2009-0073514 filed on Aug. 10, 2009 and Korean patent application number 10-2009-0113230 filed on Nov. 23, 2009 which are incorporated herein by reference in their entireties.

BACKGROUND OF THE INVENTION

The present invention relates to a semiconductor package and a stacked semiconductor package having the same.

These days, semiconductor packages with semiconductor chips capable of storing and processing a huge amount of data within a short period have been developed.

Recently, in order to improve the data storage capacity and data processing speed of a semiconductor package, a stacked semiconductor package, in which at least two semiconductor chips are stacked, has been developed.

In order to realize a stacked semiconductor package, a chip selection technology for selecting any one semiconductor chip among a plurality of stacked semiconductor chips is required.

In particular, in the case of stacking a plurality of the same kind of semiconductor chips, it is difficult to select the semiconductor chip specified among the plurality of stacked semiconductor chips.

BRIEF SUMMARY OF THE INVENTION

Embodiments of the present invention include a semiconductor package suitable for selecting any one semiconductor chip among a plurality of stacked semiconductor chips.

Also, embodiments of the present invention include a stacked semiconductor package constructed using a semiconductor package suitable for selecting any one semiconductor chip among a plurality of stacked semiconductor chips.

In one embodiment of the present invention, a semiconductor package comprises a semiconductor chip possessing a shape with corners, and having chamfered portions which are formed in a first corner group composed of one or more of the corners and a circuit section; data bonding pads disposed on the semiconductor chip and electrically connected to the circuit section; and a chip selection pad disposed adjacent to a second corner group composed of at least one corner which is not formed with a chamfered portion, and electrically connected to the circuit section.

The chamfered portion and an edge of the semiconductor chip, which extends from the chamfered portion, may define an obtuse angle.

The chamfered portion and an edge of the semiconductor chip, which extends from the chamfered portion, may define a right angle.

The chamfered portion may have a rounded shape when viewed from the top.

At least two chip selection pads may be disposed adjacent to the second corner group.

The semiconductor package may further comprise through-electrodes passing through the data bonding pads and portions of the semiconductor chip which correspond to the data bonding pads.

The data bonding pads may be formed in the shape of a square matrix when viewed from the top, and an interval between the data bonding pads may be the same.

In another embodiment of the present invention, a stacked semiconductor package comprises a plurality of semiconductor packages each including a semiconductor chip possessing a shape with corners, and having chamfered portions which are formed in a first corner group composed of one or more of the corners and a circuit section, data bonding pads disposed on the semiconductor chip and electrically connected to the circuit section, and a chip selection pad disposed adjacent to a second corner group composed of at least one corner which is not formed with a chamfered portion, and electrically connected to the circuit section, wherein the respective semiconductor packages are vertically stacked, chip selection pads of the semiconductor packages are exposed by chamfered portions, and data bonding pads of the respective semiconductor packages are electrically connected to one another.

The respective semiconductor packages may include through-electrodes which pass through respective semiconductor chips and electrically connect the data bonding pads of the respective semiconductor chips.

The stacked semiconductor package may further comprise a substrate having the stacked semiconductor packages mounted thereto, and including data connection pads which are electrically connected to the through-electrodes and chip selecting connection pads which are disposed close to the chip selection pads outside the chip selection pads; and connection members electrically connecting the chip selection pads, which are exposed out of the chamfered portions, with the chip selecting connection pads corresponding to the chip selection pads.

The chip selection pads may be completely exposed by the chamfered portions.

The chip selection pads may be partially covered by the chamfered portions, and remaining portions of the chip selection pads may be exposed.

The chamfered portion and an edge of the semiconductor chip of the semiconductor package, which extends from the chamfered portion, may define an obtuse angle.

The chamfered portion and an edge of the semiconductor chip of the semiconductor package, which extends from the chamfered portion, may define a right angle.

The chamfered portion may have a rounded shape when viewed from the top, to expose the chip selection pad.

At least two chip selection pads may be disposed adjacent to the second corner group of each semiconductor chip of the semiconductor package, and the chip selecting connection pads may have a number corresponding to the number of the chip selection pads.

The data bonding pads may be formed in the shape of a square matrix when viewed from the top, and an interval between the data bonding pads may be the same.

The semiconductor chips of the semiconductor packages may be stacked by being sequentially rotated by 90° when viewed from the position of the chip selection pad.

DESCRIPTION OF SPECIFIC EMBODIMENTS

Hereafter, specific embodiments of the present invention will be described in detail with reference to the accompanying drawings.

It is understood herein that the drawings are not necessarily to scale and in some instances proportions may have been exaggerated in order to more clearly depict certain features of the invention.

Figure 1:
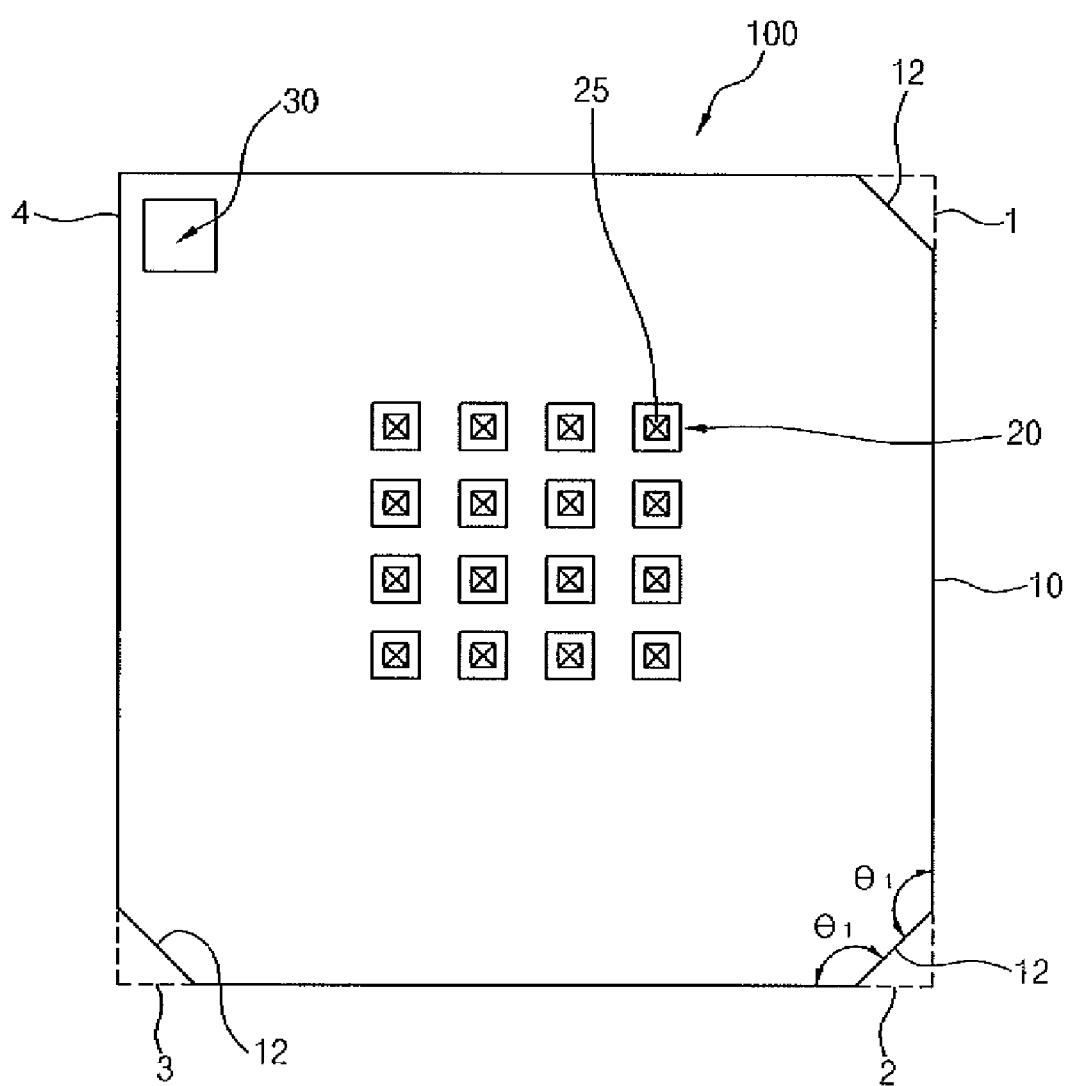
FIG. 1 is a plan view showing a semiconductor package in accordance with an embodiment of the present invention.

FIG. 1 is a plan view showing a semiconductor package in accordance with an embodiment of the present invention.

Referring to FIG. 1, a semiconductor package 100 includes a semiconductor chip 10, data bonding pads 20 and a chip selection pad 30.

The semiconductor chip 10 has the shape of, for example, a quadrangular plate. While it is illustrated and explained in the embodiment that the semiconductor chip 10 has the shape of a quadrangular plate, it is conceivable that the semiconductor chip 10 can have various other shapes in place of the quadrangular plate shape. For example, the semiconductor chip 10 can have the shape of a triangular plate or a pentagonal plate.

The semiconductor chip 10 includes a circuit section which has a data processing unit (not shown) for processing data and a data storage unit (not shown) for storing data.

The semiconductor chip 10 having the quadrangular plate shape possesses four corners 1, 2, 3 and 4 when viewed from the top. According to an embodiment, for example, three corners 1, 2 and 3 are included in a first corner group 1, 2 and 3, and the remaining one corner 4 not included in the first corner group 1, 2 and 3 is included in a second corner group 4. The first corner group can, for example, include one to three corners.

The corners 1, 2 and 3 of the first corner group are chamfered so as to form chamfered portions 12.

In an embodiment, the chamfered portions 12 which are formed in corners of the first corner group 1, 2 and 3 have a triangular cut shape when the corners of the semiconductor chip 10 are viewed from the top. Due to this fact, the chamfered portions 12 and the edges of the semiconductor chip 10 which extend from the chamfered portions 12 define obtuse angles θ1.

Figure 2:
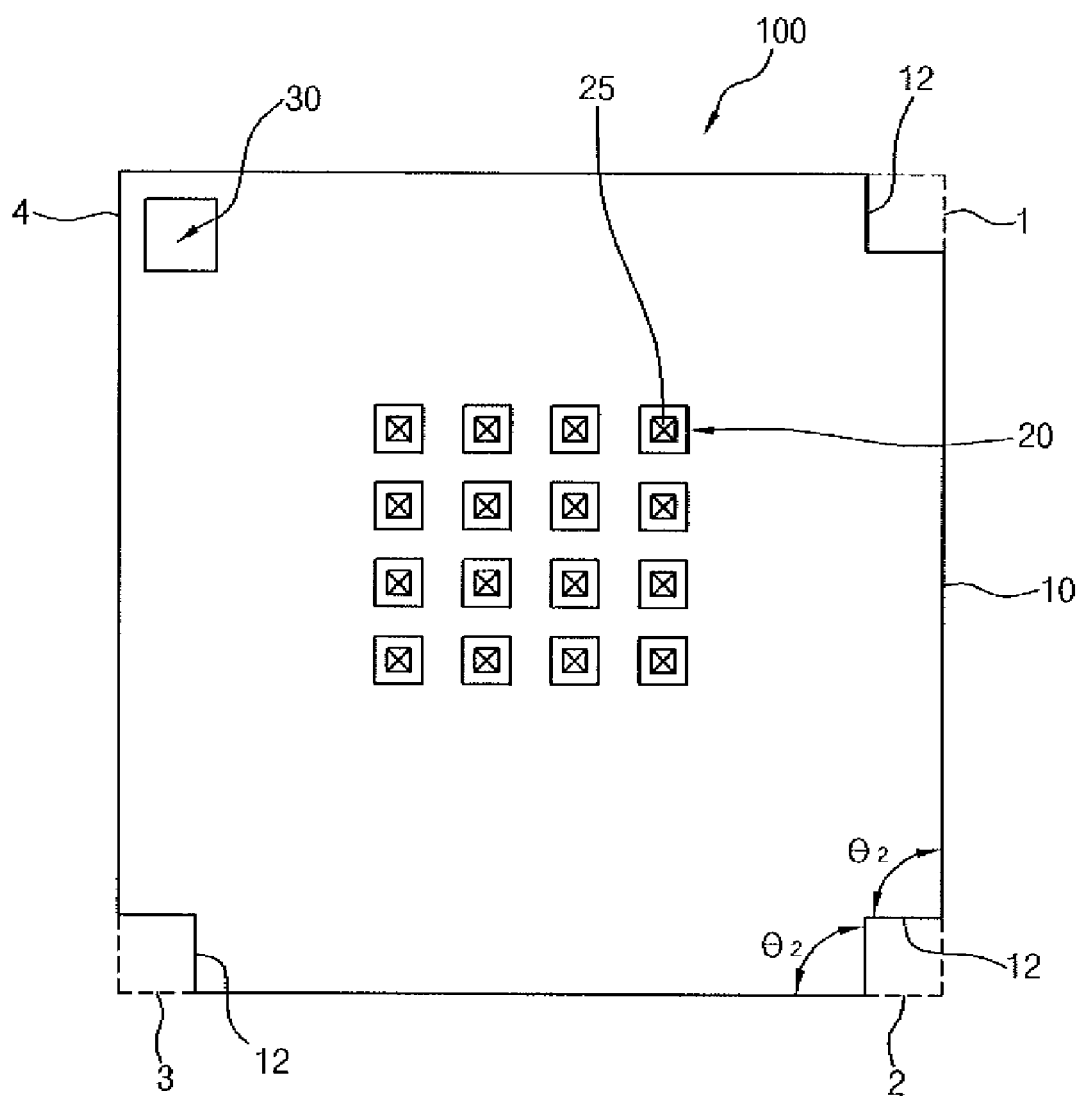
FIG. 2 is a plan view showing a semiconductor package in accordance with another embodiment of the present invention.

Referring to FIG. 2, in another embodiment, the chamfered portions 12 which are formed in corners of the first corner group 1, 2 and 3 have a quadrangular cut shape when the corners of the semiconductor chip 10 are viewed from the top. Due to this fact, the chamfered portions 12 and the edges of the semiconductor chip 10 which extend from the chamfered portions 12 define right angles θ2.

Figure 3:
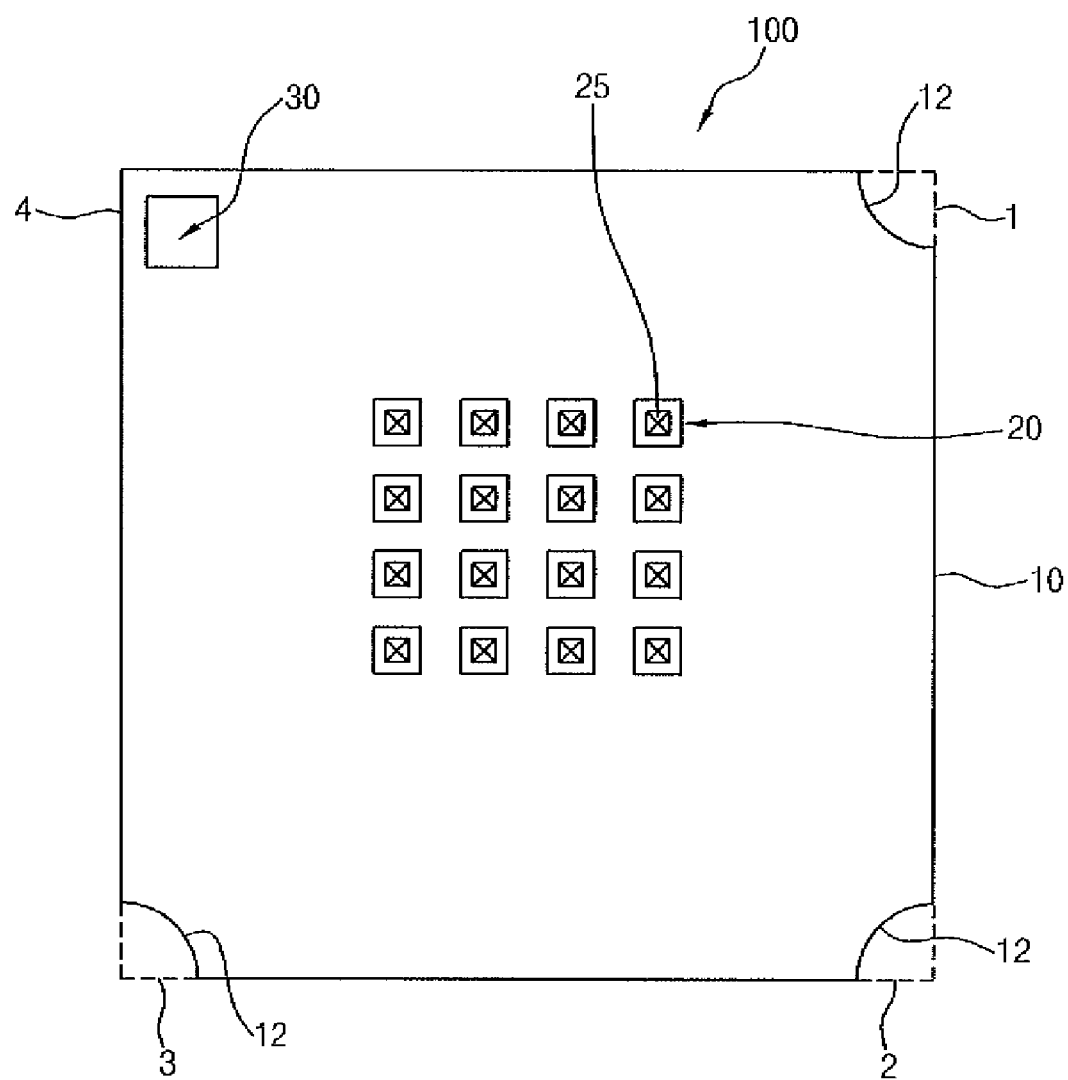
FIG. 3 is a plan view showing a semiconductor package in accordance with another embodiment of the present invention.

Referring to FIG. 3, in another embodiment, the chamfered portions 12 which are formed in corners of the first corner group 1, 2 and 3 have a round cut shape when the corners of the semiconductor chip 10 are viewed from the top.

Referring back to FIG. 1, the data bonding pads 20 can be formed in one row or two rows on the center portion of the upper surface or the lower surface facing away from the upper surface of the semiconductor chip 10. Alternatively, the data bonding pads 20 can be formed in one row or two rows along an edge of the upper surface or the lower surface of the semiconductor chip 10. The data bonding pads 20 are electrically connected to the circuit section of the semiconductor chip 10.

In an embodiment, the data bonding pads 20 are disposed in the form of a square matrix on the center portion of the upper surface or the lower surface facing away from the upper surface of the semiconductor chip 10. The data bonding pads 20 disposed in the form of a square matrix are formed to have the same shape and the same interval between data bonding pads 20.

In an embodiment, the semiconductor chip 10 includes through-electrodes 25 which pass through the data bonding pads 20 and portions of the semiconductor chip 10 corresponding to the data bonding pads 20.

That is, the through-electrodes 25 sequentially pass through the data bonding pads 20 and the semiconductor chip 10. Connection members such as, for example, solder can be disposed on at least one end of the two ends of the individual through-electrodes 25.

The chip selection pad 30 is disposed on the upper surface of the semiconductor chip 10. The chip selection pad 30 is formed adjacent to the second corner group 4 of the semiconductor chip 10 which is not formed as a chamfered portion 12. The chip selection pad 30 is electrically connected to the circuit section of the semiconductor chip 10. The chip selection pad 30 is to be inputted with a chip selection signal for selecting a semiconductor chip.

Figure 4:
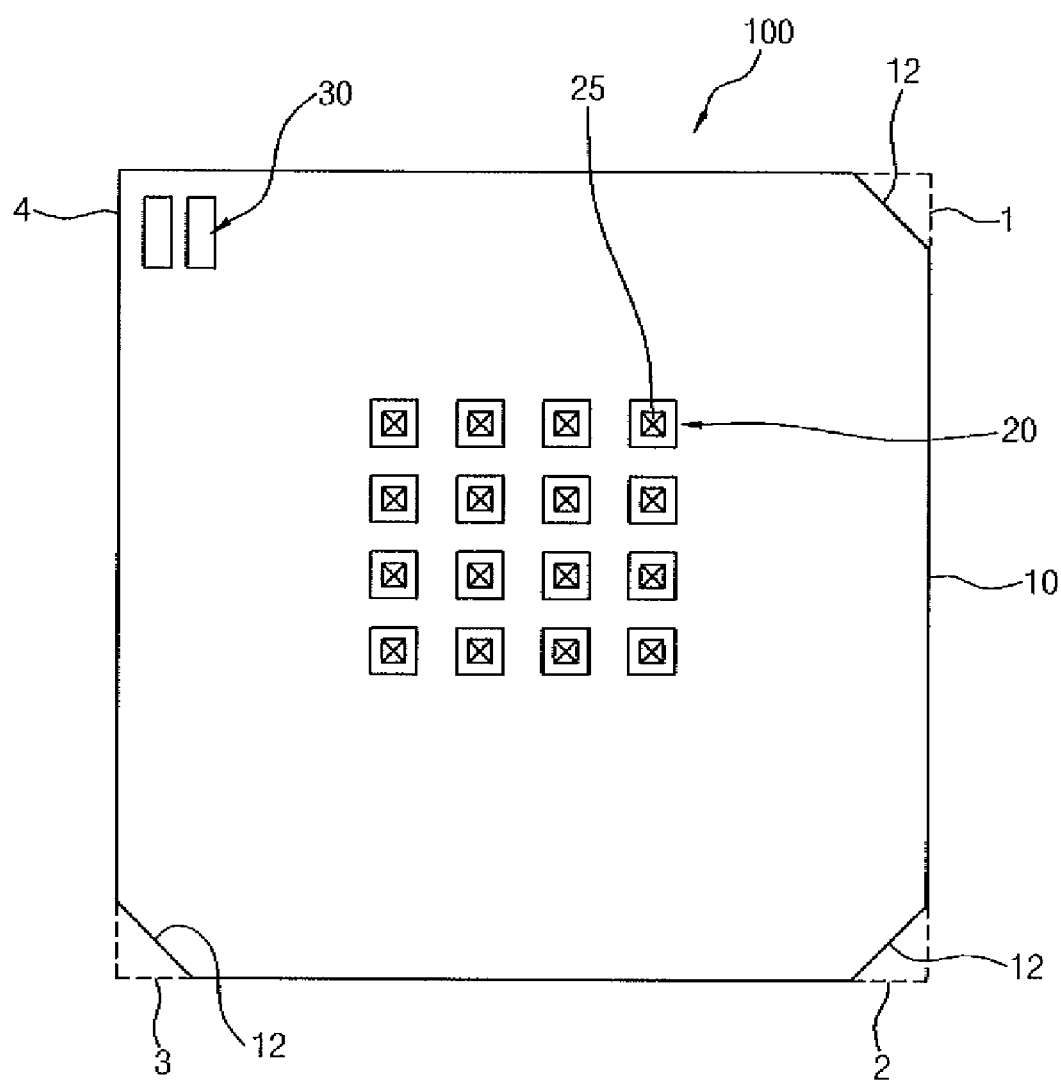
FIG. 4 is a plan view showing a semiconductor package in accordance with another embodiment of the present invention.

In an embodiment, at least two chip selection pads 30 can be disposed adjacent to the second corner group 4 in such a way as to adjoin each other, as shown in FIG. 4.

Figure 5:
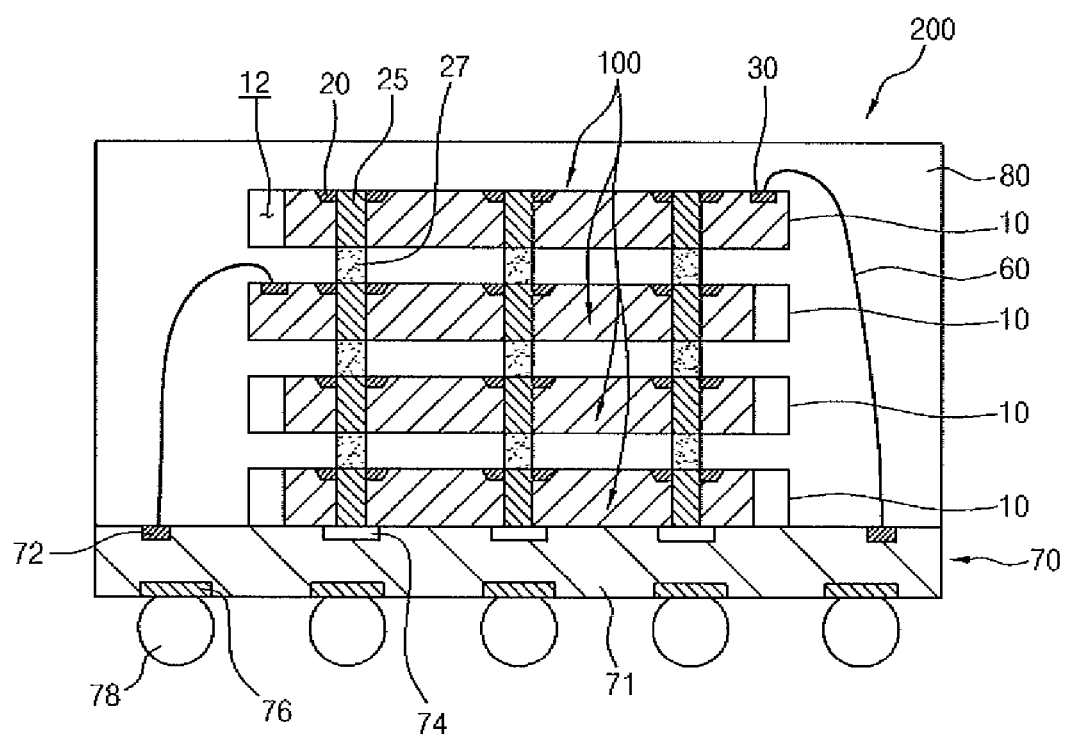
FIG. 5 is a cross-sectional view showing a stacked semiconductor package in accordance with another embodiment of the present invention.
Figure 6:
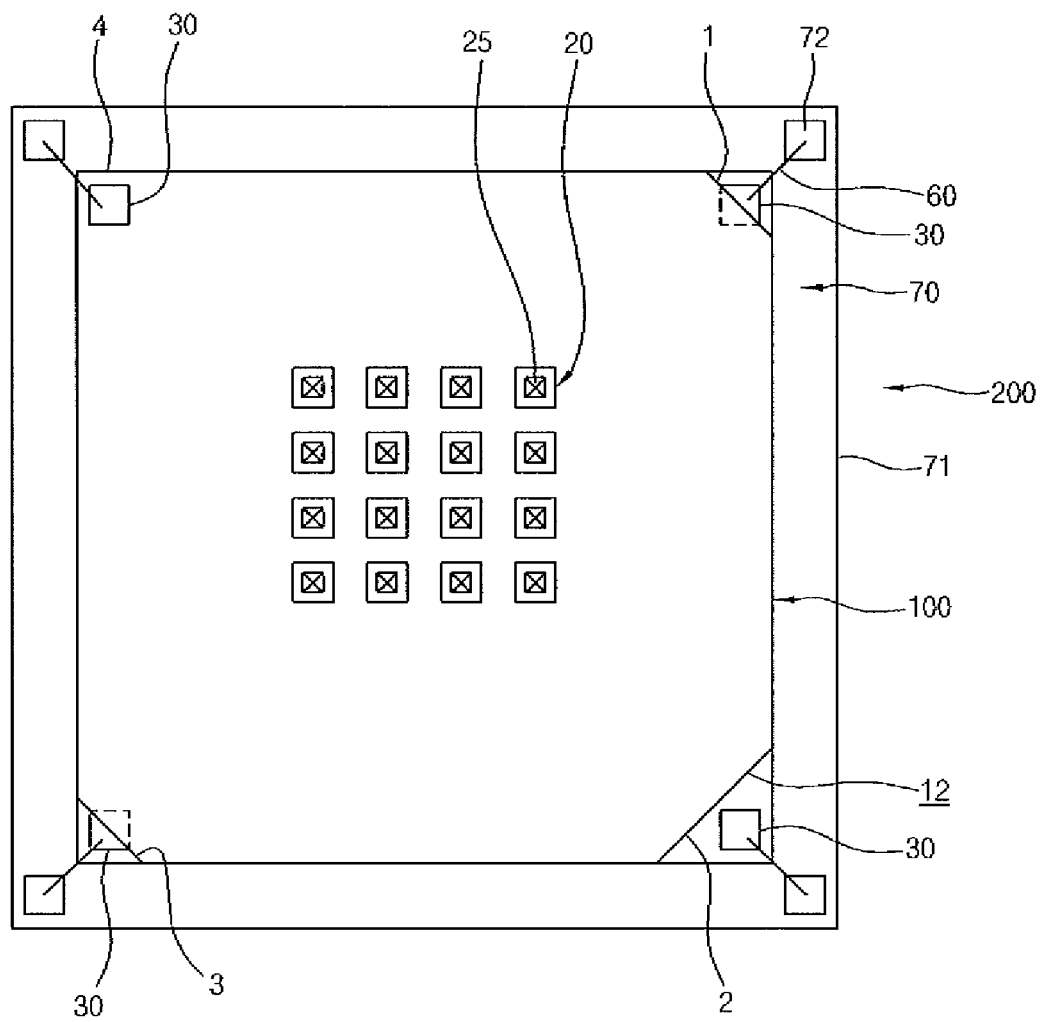
FIG. 6 is a plan view of the stacked semiconductor package shown in FIG. 5.

FIG. 5 is a cross-sectional view showing a stacked semiconductor package in accordance with an embodiment of the present invention, and FIG. 6 is a plan view of the stacked semiconductor package shown in FIG. 5.

Referring to FIGS. 5 and 6, a stacked semiconductor package 200 includes a plurality of semiconductor packages 100. In an embodiment, the stacked semiconductor package 200 includes, for example, four semiconductor packages 100, connection members 60, a substrate 70, and a molding member 80.

Each semiconductor package 100 includes a semiconductor chip 10 possessing a first corner group 1, 2 and 3 which has corners formed with chamfered portions 12 and a second corner group 4 which has a corner not formed with a chamfered portion 12, data bonding pads 20, and a chip selection pad 30.

In an embodiment, the chamfered portions 12 of corners which are included in the first corner group 1, 2 and 3 can have a triangular cut shape when the corners of the semiconductor chip 10 are viewed from the top, and due to this fact, the chamfered portions 12 and the edges of the semiconductor chip 10 which extend from the chamfered portions 12 define obtuse angles. Alternatively, the chamfered portions 12 which are formed in the first corner group 1, 2 and 3 can have a quadrangular cut shape when the corners of the semiconductor chip 10 are viewed from the top, and due to this fact, the chamfered portions 12 and the edges of the semiconductor chip 10 which extend from the chamfered portions 12 can define right angles. In still another alternative, the chamfered portions 12 which are formed in the first corner group 1, 2 and 3 can have a round cut shape when the corners of the semiconductor chip 10 are viewed from the top.

The data bonding pads 20 can be disposed in the form of a square matrix on the center portion of the upper surface of the semiconductor chip 10 of each semiconductor package 100, and the chip selection pad 30 is disposed adjacent to a corner of the second corner group 4. In an embodiment, at least two chip selection pads 30 can be disposed adjacent to the second corner group 4.

In an embodiment, for example, four semiconductor packages 100 are stacked in the vertical direction. When stacking the four semiconductor packages 100, the chip selection pad 30 of a downwardly placed semiconductor package 100 is exposed by a chamfered portion 12 of an upwardly placed semiconductor package 100 (see, for example, the uppermost two semiconductor chips shown in FIG. 5). To this end, when stacking the four semiconductor packages 100, it is preferred that the respective semiconductor chips 100 be sequentially stacked by being rotated by 90° when viewed from the position of the chip selection pad 30 so that the chip selection pads 30 of the respective semiconductor chips 100 are exposed.

In an embodiment, the second corner group 4 of a downwardly placed semiconductor package 100 and the second corner group 4 of an upwardly placed semiconductor package 100 are disposed so as to not overlap with each other. That is, for any two adjacent packages 100 of the plurality of semiconductor packages, the corner of the second corner group 4 which includes the chip selection pad of one semiconductor package does not overlap with the corner of the second corner group 4 which includes the chip selection pad of the other adjacent semiconductor package. The second corner group 4 of a downwardly placed semiconductor package 100 is aligned with any one of the corners of the first corner group 1, 2 and 3 of an upwardly placed semiconductor package 100.

In the embodiment, the chip selection pads 30 of the four stacked semiconductor packages 100 can be completely exposed by the chamfered portions 12 as shown in FIG. 6. Alternatively, it can be envisaged that only portions of the chip selection pads 30 of the four stacked semiconductor packages 100 are exposed by the chamfered portions 12.

The through-electrodes 25 of the four stacked semiconductor packages 100 are electrically connected to one another by the medium of connection members 27 such as solder. The four stacked semiconductor packages 100 are mounted onto the substrate 70.

The substrate 70 includes a substrate body 71, chip selecting connection pads 72, data connection pads 74, ball lands 76, and solder balls 78.

The substrate body 71 has, for example, a plate-like shape, and the four stacked semiconductor packages 100 are disposed on the upper surface of the substrate body 71.

The data connection pads 74 are disposed on the upper surface of the substrate body 71 and are electrically connected to the through-electrodes 25 of the semiconductor packages 100.

The chip selecting connection pads 72 are disposed on the upper surface of the substrate body 71 outside the area occupied by the stacked semiconductor packages 100. The chip selecting connection pads 72 are disposed at positions close to the chip selection pads 30 which are formed on the semiconductor chips 10 of the respective semiconductor packages 100.

The ball lands 76 are disposed on the lower surface of the substrate body 71 and are electrically connected to the data connection pads 74 and the chip selecting connection pads 72. The solder balls 78 are electrically connected to the respective ball lands 76.

The connection members 60 electrically connect the chip selection pads 30 of the respective semiconductor packages 100 to the chip selecting connection pads 72 of the substrate 70. In an embodiment, the connection members 60 comprise, for example, thread-shaped bonding wires.

In an embodiment, when wire-bonding the chip selecting connection pads 72 and the chip selection pads 30 by the connection members 60 (such as bonding wires), since the chip selection pads 30 are exposed due to the formation of the chamfered portions 12, wire bonding can be easily conducted, and since it is not necessary to place spacers between the semiconductor chips 100, the volume of the stacked semiconductor package 200 can be significantly decreased.

In an embodiment, by supplying chip selection signals to the respective semiconductor packages 100 through the connection members 60, a specified semiconductor package 100 can be selected among the plurality of semiconductor packages 100.

The molding member 80 covers the four stacked semiconductor packages 100, the upper surface of the substrate 70 and the connection members 60. The molding member 80 protects the stacked semiconductor packages 100 and the connection members 60 from shocks and/or vibrations applied from an outside.

As is apparent from the above description, the present invention provides advantages in that, since a portion of a semiconductor chip is cut away or removed and a semiconductor package and a substrate are connected by a conductive wire bonded to the semiconductor chip where the portion is removed, a specified semiconductor package can be easily selected among a plurality of semiconductor packages.

Although specific embodiments of the present invention have been described for illustrative purposes, those skilled in the art will appreciate that various modifications, additions and substitutions are possible, without departing from the scope and spirit of the invention as disclosed in the accompanying claims.

What is claimed is:

1. A semiconductor package comprising:
   a semiconductor chip having a shape with corners and formed a circuit section therein, the semiconductor chip having one or more chamfered portions which are formed in a first corner group that includes one or more of the corners, wherein the chamfered portions pass through the semiconductor chip when viewed from the top of the semiconductor chip;
   at least one data bonding pad disposed on the semiconductor chip and electrically connected to the circuit section; and
   a chip selection pad disposed adjacent to a second corner group that includes at least one of the corners which is not formed with a chamfered portion, the chip selection pad being electrically connected to the circuit section.

2. The semiconductor package according to claim 1, wherein the chamfered portion and an edge of the semiconductor chip, which extends from the chamfered portion, define an obtuse angle.

3. The semiconductor package according to claim 1, wherein the chamfered portion and an edge of the semiconductor chip, which extends from the chamfered portion, define a right angle.

4. The semiconductor package according to claim 1, wherein the chamfered portion has a rounded shape when viewed from the top of the semiconductor chip.

5. The semiconductor package according to claim 1, wherein at least two chip selection pads are disposed adjacent to the second corner group.

6. The semiconductor package according to claim 1, further comprising:
   through-electrodes passing through the data bonding pads and portions of the semiconductor chip which correspond to the data bonding pads.

7. The semiconductor package according to claim 1, wherein the data bonding pads are formed in the shape of a square matrix on the semiconductor chip when viewed from the top of the semiconductor package with intervals between the data bonding pads being the same.

8. A stacked semiconductor package comprising:
a plurality of semiconductor packages each including:
a semiconductor chip having a shape with corners and formed a circuit section therein, the semiconductor chip having one or more chamfered portions which are formed in a first corner group that includes one or more of the corners,
at least one data bonding pad disposed on the semiconductor chip and electrically connected to the circuit section, and
a chip selection pad disposed adjacent to a second corner group that includes at least one of the corners which is not formed with a chamfered portion, the chip selection pad being electrically connected to the circuit section,
wherein the semiconductor packages are vertically stacked such that the chip selection pad of any one of the semiconductor packages is exposed by a chamfered portion of another of the semiconductor packages, and the at least one data bonding pad of the respective semiconductor packages are electrically connected to one another.

9. The stacked semiconductor package according to claim 8, wherein the respective semiconductor packages include through-electrodes which pass through respective semiconductor chips and electrically connect the data bonding pads of the respective semiconductor chips.

10. The stacked semiconductor package according to claim 9, further comprising:
a substrate having the stacked semiconductor packages mounted thereto, the substrate including
data connection pads which are electrically connected to the through-electrodes, and
chip selecting connection pads which are disposed outside the chip selection pads; and
connection members electrically connecting the chip selection pads, which are exposed by the chamfered portions, to the chip selecting connection pads corresponding to the chip selection pads.

11. The stacked semiconductor package according to claim 8, wherein the chip selection pads are completely exposed by the chamfered portions.

12. The stacked semiconductor package according to claim 8, wherein the chip selection pads are partially covered by the chamfered portions, and remaining portions of the chip selection pads are exposed.

13. The stacked semiconductor package according to claim 8, wherein the chamfered portion and an edge of the semiconductor chip of the semiconductor package, which extends from the chamfered portion, define an obtuse angle.

14. The stacked semiconductor package according to claim 8, wherein the chamfered portion and an edge of the semiconductor chip of the semiconductor package, which extends from the chamfered portion, define a right angle.

15. The stacked semiconductor package according to claim 8, wherein the chamfered portion has a rounded shape when viewed from the top of the semiconductor chip, to expose the chip selection pad.

16. The stacked semiconductor package according to claim 8, wherein at least two chip selection pads are disposed adjacent to the second corner group of the semiconductor chip of each of the semiconductor packages, and the number of the chip selecting connection pads is the same as the number of the chip selection pads.

17. The stacked semiconductor package according to claim 8, wherein the data bonding pads of each semiconductor package are formed in the shape of a square matrix on the semiconductor chip when viewed from the top of the semiconductor package with intervals between the data bonding pads being the same.

18. The stacked semiconductor package according to claim 8, wherein each of the semiconductor chips of the semiconductor packages has a plate-like shape with four of the corners, and the semiconductor packages are stacked such that the semiconductor chips are sequentially rotated by 90° when viewed from the position of the chip selection pad.

* * * * *